(12) United States Patent
Cheng

(10) Patent No.: US 10,510,745 B2
(45) Date of Patent: Dec. 17, 2019

(54) ARRAY SUBSTRATE AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 23 days.

(21) Appl. No.: 15/674,941

(22) Filed: Aug. 11, 2017

(65) Prior Publication Data

US 2018/0108649 A1   Apr. 19, 2018

(30) Foreign Application Priority Data

Oct. 18, 2016 (CN) ...................... 2016 2 1136018 U

(51) Int. Cl.
*H01L 27/02* (2006.01)
*G02F 1/1362* (2006.01)
*H01L 27/12* (2006.01)

(52) U.S. Cl.
CPC .... *H01L 27/0292* (2013.01); *G02F 1/136204* (2013.01); *G02F 1/136286* (2013.01); *H01L 27/0255* (2013.01); *H01L 27/124* (2013.01); *G09G 2330/04* (2013.01)

(58) Field of Classification Search
CPC ............. H01L 27/0292; H01L 27/0255; H01L 27/124; G02F 1/136204; G02F 1/136286; G02F 2001/136218; G09G 2330/04
See application file for complete search history.

(56) References Cited

U.S. PATENT DOCUMENTS

| | | | | |
|---|---|---|---|---|
| 7,626,647 | B2* | 12/2009 | Ker ...................... | H01L 29/7436 257/E21.388 |
| 7,773,164 | B2* | 8/2010 | Chang ................. | H01L 27/0248 257/59 |
| 9,000,796 | B2* | 4/2015 | Shirouzu ........... | G02F 1/136204 324/760.02 |
| 9,041,874 | B2* | 5/2015 | Chang ............... | G02F 1/136204 349/40 |
| 2012/0069286 | A1* | 3/2012 | Huang .............. | G02F 1/136227 349/147 |
| 2015/0325188 | A1* | 11/2015 | Wei ....................... | G09G 3/3648 345/92 |
| 2017/0052416 | A1* | 2/2017 | Huang .............. | G02F 1/136204 |
| 2018/0052372 | A1* | 2/2018 | Xu ....................... | H01L 27/0296 |

FOREIGN PATENT DOCUMENTS

CN      201410192766       *   5/2014

* cited by examiner

*Primary Examiner* — Tuan A Hoang
(74) *Attorney, Agent, or Firm* — Brooks Kushman P.C.

(57) ABSTRACT

An array substrate and a display device are provided. The array substrate includes a display region and a peripheral region surrounding the display region. Gate lines and data lines crossing the gate lines are arranged at the display region. A static charge shielding unit is arranged at the peripheral region. The array substrate further includes a static charge releasing line connected to the static charge shielding unit, and the static charge shielding unit is configured to release static charges at the peripheral region through the static charge releasing line.

18 Claims, 6 Drawing Sheets

ARRAY SUBSTRATE AND DISPLAY DEVICE

CROSS-REFERENCE TO RELATED APPLICATION

The present application claims a priority of the Chinese application No. 201621136018.5 filed on Oct. 18, 2016, which is incorporated herein by reference in its entirety.

TECHNICAL FIELD

The present disclosure relates to the field of display technology, in particular to an array substrate and a display device.

BACKGROUND

As a flat-panel display device, a Thin Film Transistor Liquid Crystal Display (TFT-LCD) has been applied more and more widely in the high-performance display field due to its characteristics such as small volume, low power consumption, being free of radiation and low manufacture cost.

The TFT-LCD includes an array substrate and another substrate arranged opposite to the array substrate to form a cell. The array substrate includes a display region and a peripheral region surrounding the display region.

Usually, during the manufacture of the array substrate, electrostatic charges may occur at the peripheral region. After the electrostatic charges at the peripheral region have been transported to the display region, electrostatic discharge (ESD) may easily occur at the display region, resulting in a large probability of the electrostatic breakdown. When the electrostatic breakdown occurs at the display region, electronic elements may be damaged, and thereby the array substrate cannot operate normally and the product quality may be deteriorated.

SUMMARY

An object of the present disclosure is to provide an array substrate and a display device, so as to prevent the generation of the electrostatic changes at the peripheral region, thereby to reduce the probability of the electrostatic breakdown at the display region.

In one aspect, the present disclosure provides in some embodiments an array substrate, including a display region and a peripheral region surrounding the display region. Gate lines and data lines crossing the gate lines are arranged at the display region. A static charge shielding unit is arranged at the peripheral region. The array substrate further includes a static charge releasing line connected to the static charge shielding unit, and the static charge shielding unit is configured to release static charges at the peripheral region through the static charge releasing line.

In a possible embodiment of the present disclosure, the static charge shielding unit includes a first electrostatic protection line parallel to the gate lines, and a first electrostatic protection unit connected to the static charge releasing line through the first electrostatic protection unit.

In a possible embodiment of the present disclosure, a data driving unit is arranged at the peripheral region and connected to the data lines, and the static charge shielding unit is arranged between the data driving unit and the display region.

In a possible embodiment of the present disclosure, the static charge shielding unit includes at least one shielding line parallel to the gate lines, and one end of the shielding line is connected to the static charge releasing line.

In a possible embodiment of the present disclosure, the static charge shielding unit includes two shielding lines between which the first electrostatic protection line is arranged.

In a possible embodiment of the present disclosure, the static charge shielding unit further includes at least one charge collection electrode connected to the at least one shielding line through a via-hole.

In a possible embodiment of the present disclosure, the at least one charge collection electrode is arranged between two adjacent data lines.

In a possible embodiment of the present disclosure, the static charge releasing line is a common electrode line.

In a possible embodiment of the present disclosure, the array substrate further includes a pixel electrode which is created from a layer identical to the charge collection electrode.

In a possible embodiment of the present disclosure, the charge collection electrode is created from a layer identical to the data lines.

In a possible embodiment of the present disclosure, the array substrate further includes a second electrostatic protection line and a second electrostatic protection unit arranged at the peripheral region. The second electrostatic protection line is arranged parallel to the gate lines, each data line is connected to the second electrostatic protection line through the second electrostatic protection unit, and the second electrostatic protection line is connected to the static charge releasing line through the second static charge protection unit.

In a possible embodiment of the present disclosure, the array substrate includes a third electrostatic protection line and a third electrostatic protection unit arranged at the peripheral region. Each gate line is connected to the third electrostatic protection line through the third electrostatic protection unit, and the third electrostatic protection line is connected to the static charge releasing line through the third electrostatic protection unit.

In a possible embodiment of the present disclosure, the array substrate further includes a fourth electrostatic protection unit, through which the third electrostatic protection line is connected to the at least one shielding line.

In a possible embodiment of the present disclosure, the first electrostatic protection unit includes two diode groups connected in parallel to each other, and each diode group includes at least one diode. The diodes in an identical diode group are connected to each other in an identical direction, and connection directions of the diodes in different diode groups are different.

In a possible embodiment of the present disclosure, each of the second electrostatic protection unit and the third electrostatic protection unit includes two diode groups connected in parallel to each other, and each diode group includes at least one diode. The diodes in an identical diode group are connected to each other in an identical direction, and connection directions of the diodes in different diode groups are different.

In a possible embodiment of the present disclosure, each of the fourth electrostatic protection unit, the fifth electrostatic protection unit and the sixth electrostatic unit includes two diode groups connected in parallel to each other, and each diode group includes at least one diode. The diodes in an identical diode group are connected to each other in an identical direction, and connection directions of the diodes in different diode groups are different.

In a possible embodiment of the present disclosure, the static charge releasing line and the third static charge protection line are both arranged parallel to, and created from a layer identical to, the data lines.

In a possible embodiment of the present disclosure, a length of the first electrostatic protection line along the gate line is greater than a length of the display region along the gate line.

In a possible embodiment of the present disclosure, the first electrostatic protection line, the second electrostatic protection line and the shielding line are created from a layer identical to the gate lines.

In another aspect, the present disclosure provides in some embodiments a display device including the above-mentioned array substrate.

According to the array substrate and the display device in the embodiments of the present disclosure, the array substrate includes the display region and the peripheral region surrounding the display region. The gate lines and the data lines crossing the gate lines are arranged at the display region. The static charge shielding unit is arranged at the peripheral region and configured to release the static charges at the peripheral region through the static charge releasing line. In this regard, the static charge shielding unit may be configured to release the static charges generated at the peripheral region, e.g., the static charges generated in the case that a metallic wire is formed at the peripheral region or a flexible printed circuit board or a driving integrated circuit is bound at the peripheral region, through the static charge releasing line, so it is able for the static charge shielding unit to release the static charges transported from the peripheral region to the display region, thereby to reduce the static charges accumulated at the display region and reduce the probability of the electrostatic breakdown.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
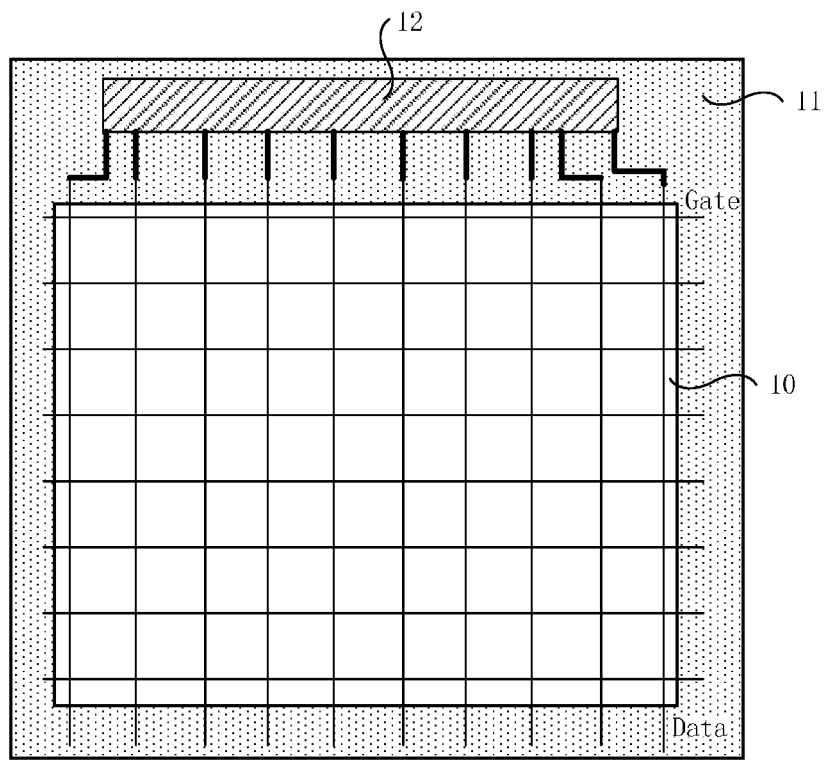
FIG. 1 is a schematic view showing an array substrate in a related art.

Usually, a TFT-LCD includes an array substrate and another substrate arranged opposite to the array substrate to form a cell. As shown in FIG. 1, the array substrate includes a display region 10 and a peripheral region 11 surrounding the display region 10. A driving integrated circuit 12 and a metal lines for connecting the driving integrated circuit 12 to a gate line Gate and a data line Data at the display region are arranged at the peripheral region 11.

During the manufacture of the array substrate, usually static charges may be generated at the peripheral region 11. For example, the static charges may be accumulated during the formation of the metal lines at the peripheral region 11. For another example, bonding pins needs to be arranged at the peripheral region 11 in the case that the driving integrated circuit 12 or a flexible printed circuit board with the driving integrated circuit 12 is bound. However, due to the limitation of the manufacture process and the environment, when the driving integrated circuit 12 or the flexible printed circuit board is bound at an incorrect position, the bonding pins may be exposed to the outside. As a result, during the manufacture and use of the TFT-LCD, the static charges may be easily accumulated at the position where the bonding pin is exposed.

Figure 2:
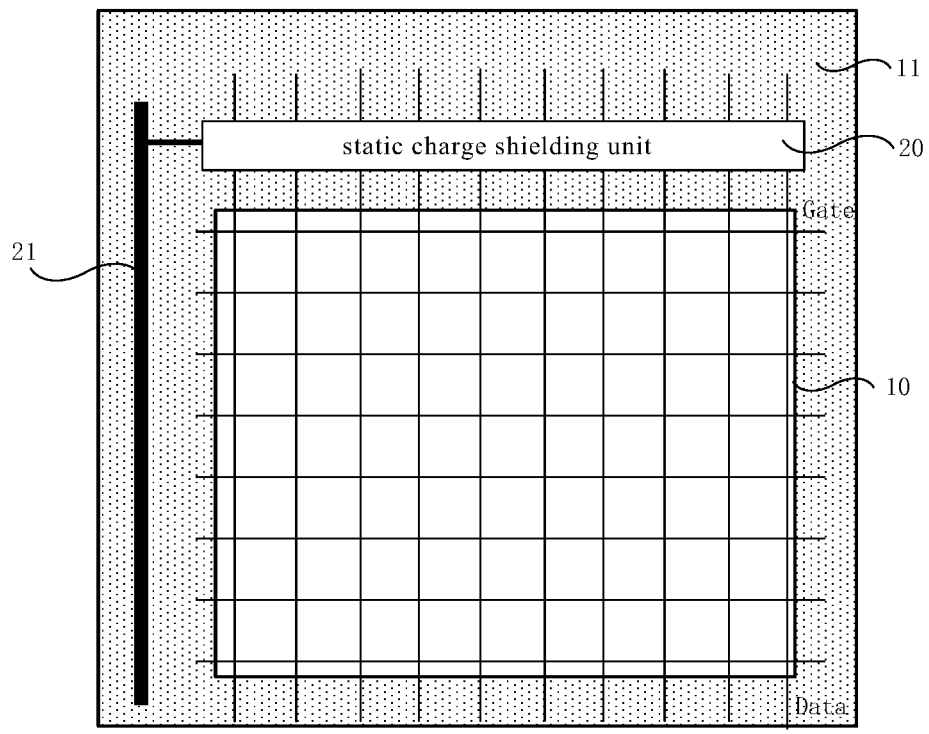
FIG. 2 is a schematic view showing an array substrate according to one embodiment of the present disclosure.

The present disclosure provides in some embodiments an array substrate which, as shown in FIG. 2, includes a display region 10 and a peripheral region surrounding the display region 10. Gate lines Gate and data lines Data crossing the gate lines are arranged at the display region 10. A static charge shielding unit 20 is arranged at the peripheral region 11.

In a possible embodiment of the present disclosure, the array substrate further includes a static charge releasing line 21 connected to the static charge shielding unit 20, and the static charge shielding unit 20 is configured to release static charges at the peripheral region 11 through the static charge releasing line 21.

It should be appreciated that, in the case that the array substrate is applied to an Advanced-Super Dimension Switching (AD-SDS, ADS for sort) display device, it may further include a common electrode, and at this time, the static charge releasing line 21 may be a common electrode line connected to the common electrode. In this regard, the static charges from the static charge shielding unit 20 to the static charge releasing line 21 may be released to and dispersed in the common electrode, so as to reduce the probability of the accumulate of the static charges, thereby to reduce the probability of the electrostatic breakdown.

In a possible embodiment of the present disclosure, in the case that the array substrate is applied to a Twisted Nematic (TN) display device, no common electrode may be arranged on the array substrate. At this time, the static charge releasing line 21 may be a storage electrode line on the array substrate, so as to release the static charges from the static charge shielding unit 20 through the storage electrode line.

In a word, the static charge shielding unit 20 may be configured to release the static charges generated at the peripheral region 11, e.g., the static charges generated during forming metal lines at the peripheral region 11 or bonding a flexible printed circuit board or a driving integrated circuit at the peripheral region 11, through the static charge releasing line 21, so it is able for the static charge shielding unit 20 to shield the static charges transported from the peripheral region 11 to the display region 10, thereby to reduce the static charges accumulated at the display region 10 and reduce the probability of the electrostatic breakdown.

Figure 4:
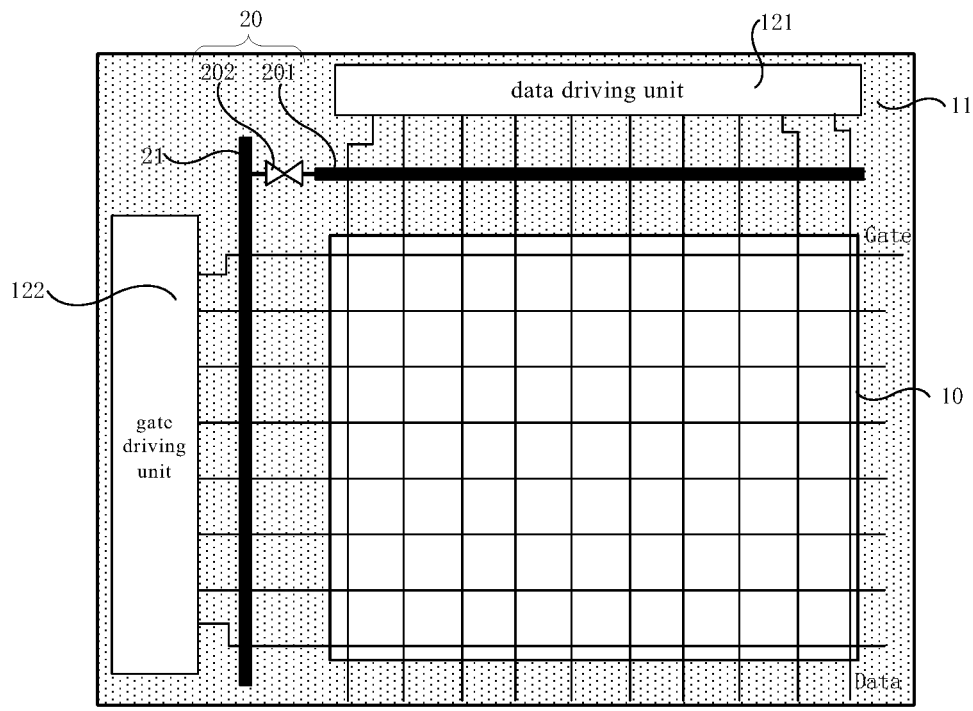
FIG. 4 is a schematic view showing the static charge shielding unit in FIG. 3.

Based on the above, as shown in FIG. 4, the static charge shielding unit 20 may further include a first electrostatic protection line 201 arranged parallel to the gate lines Gate and created from a layer identical to the gate lines Gate. In a possible embodiment of the present disclosure, a length of the first electrostatic protection line 201 along the gate lines Gate is greater than a length of the display region 11 along the gate lines Gate. In this regard, it is able for the first electrostatic protection line 201 to discharge the static charges generated at the peripheral region 11, e.g., accumulated in the case that a metal line is arranged at the peripheral region, through the static charge releasing line 21, so as to prevent the static charges at the peripheral region 11 from being transported to the display region 10.

Figure 3:
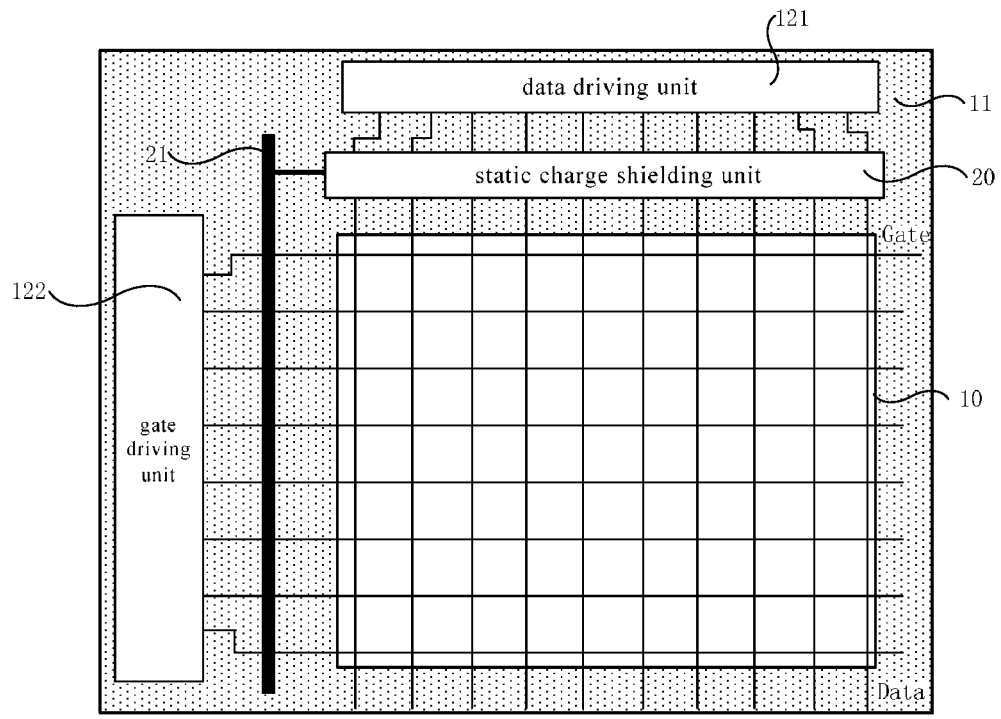
FIG. 3 is a schematic view showing an optional position of a static charge shielding unit in FIG. 2.

In addition, usually a driving unit for applying a driving signal to the gate lines Gate or the data lines Data at the display region may be arranged at the peripheral region 11. To be specific, as shown in FIG. 3, the driving unit includes a data driving unit 121 connected to the data lines Data and configured to apply a data signal to the data lines Data, so as to charge subpixels connected to the corresponding data lines Data. The driving unit further includes a gate driving unit 122 connected to the gate lines Gate and configured to apply a gate scanning signal to the gate lines Gate progressively, so as to turn on the subpixels connected to the respective gate lines.

In the embodiments of the present disclosure, the data driving unit 121 may be a driver integrated circuit for a data lines, or a flexible printed circuit (FPC) to which the driver integrated circuit is bound. Due to the limitation of the manufacture process and the environment, in the case that the driver integrated circuit or the FPC to which the driver integrated circuit is bound is located at an incorrect position, a bonding pin at a bonding position may be exposed to the outside, so the static charges may be accumulated at the position where the bonding pin is exposed during the manufacture and use of the array substrate.

In addition, in a possible embodiment of the present disclosure, the gate driving unit 122 may be a driver integrated circuit for the gate scanning signal, or an FPC to which the driver integrated circuit is bound. In order to simplify the manufacture process and facilitate the design of a narrow bezel, usually a Gate Driver on Array (GOA) design may be adopted, and during the formation of a TFT, the gate lines Gate or the data lines Data at the display region 10 of the array substrate, the gate driving unit 122 may be integrated at the peripheral region 11.

In a word, in a possible embodiment of the present disclosure, as shown in FIG. 3, the static charge shielding unit 20 may be at least arranged between the data driving unit 121 and the display region 10, so as to prevent the static charges generated at the peripheral region 11 from being transported to the display region 10 through the static charge shielding unit 20.

Based on the above, the static charge shielding unit 20 may include the first electrostatic protection line 201, a length of which along the gate lines Gate is greater than a length of the display region 11 along the gate lines Gate. In this regard, it is able for the first electrostatic protection line 201 to discharge the static charges generated by the driver integrated circuit for the data signal or the FPC to which the driver integrated circuit is bound at the bonding position of the peripheral region 11 through the static charge releasing line 21, so as to prevent the static charges at the peripheral region 11 from being transported to the display region 10.

Based on the above, the static charge shielding unit 20 further includes a first electrostatic protection unit 202, and the first electrostatic protection line 201 is connected to the static charge releasing line 21 through the first electrostatic protection unit 202.

In the embodiments of the present disclosure, one element may be connected to the other element directly or electrically.

Figure 5:
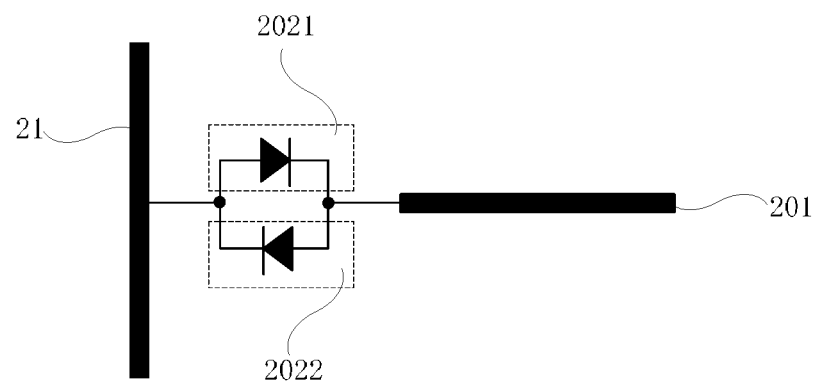
FIG. 5 is a schematic view showing a first electrostatic protection unit in FIG. 4.
Figure 6:
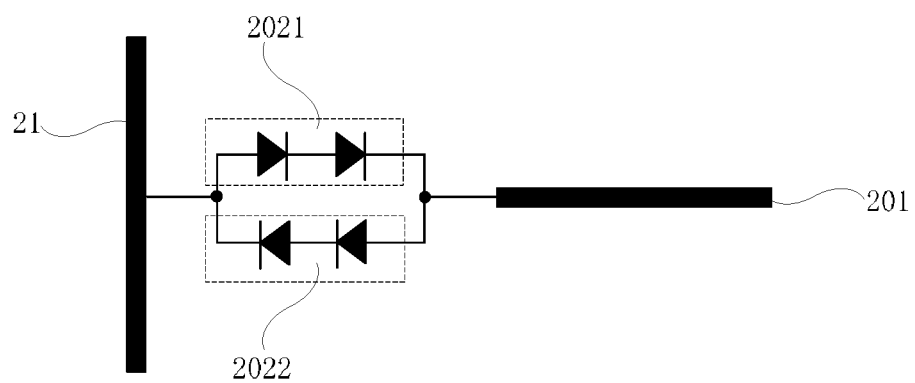
FIG. 6 is another schematic view showing the first electrostatic protection unit in FIG. 4.

To be specific, the first electrostatic protection unit 202 may include two diode groups connected in parallel to each other, e.g., a first diode group 2021 and a second diode group 2022 as shown in in FIG. 5 or 6. Each diode group includes at least one diode.

It should be appreciated that, the diode may be a thin film transistor where a source electrode and a gate electrode are connected to each other, or a drain electrode and the gate electrode are connected to each other.

In this case, the diodes in an identical diode group are connected to each other in an identical direction, and the connection directions of the diodes in different diode groups are different.

For example, as shown in FIG. 5, each diode group includes one diode. In the case that an anode of a diode of the first diode group 2021 is connected to the static charge releasing line 21 and a cathode thereof is connected to the first electrostatic protection line 201, an anode of a diode of the second diode group 2022 may be connected to the first electrostatic protection line 201 and a cathode thereof may be connected to the static charge releasing line 21.

For another example, as shown in FIG. 6, each diode group includes two diodes connected in series to each other. In the case that an anode of one diode of the first diode group 201 (i.e., the diode adjacent to the static charge releasing line 21) is connected to the static charge releasing line 21 and a cathode of the other diode of the first diode group 201 (i.e., the diode adjacent to the first electrostatic protection line 201) is connected to the first electrostatic protection line 201, an anode of one diode of the second diode group 202 (i.e., the diode adjacent to the first electrostatic protection line 201) may be connected to the first electrostatic protection line 201, and a cathode of the other diode of the second diode group 202 (i.e., the diode adjacent to the static charge releasing line 21) may be connected to the static charge releasing line 21.

Based on the above, when there are the static charges on the first electrostatic protection line 201, the second diode group 2022 may be turned on, so as to discharge the static charges on the first electrostatic protection line 201 to the static charge releasing line 21 through the first electrostatic protection unit 202. When there are the static charges on the static charge releasing line 21, the first diode group 2021 may be turned on, so as to discharge the static charges on the static charge releasing line 21 to the first electrostatic protection line 201 through the first electrostatic protection unit 202.

Of course, the above description is merely given by taking each diode group including one or two diodes as an example. In the case that each diode group includes three or more diodes, the diodes in each diode group may be connected in series to each other, and the connection directions of the diodes in different diode groups may be different as mentioned above.

In addition, the first electrostatic protection unit 202 may further include a plurality of resistors connected in series to each other.

Figure 7:
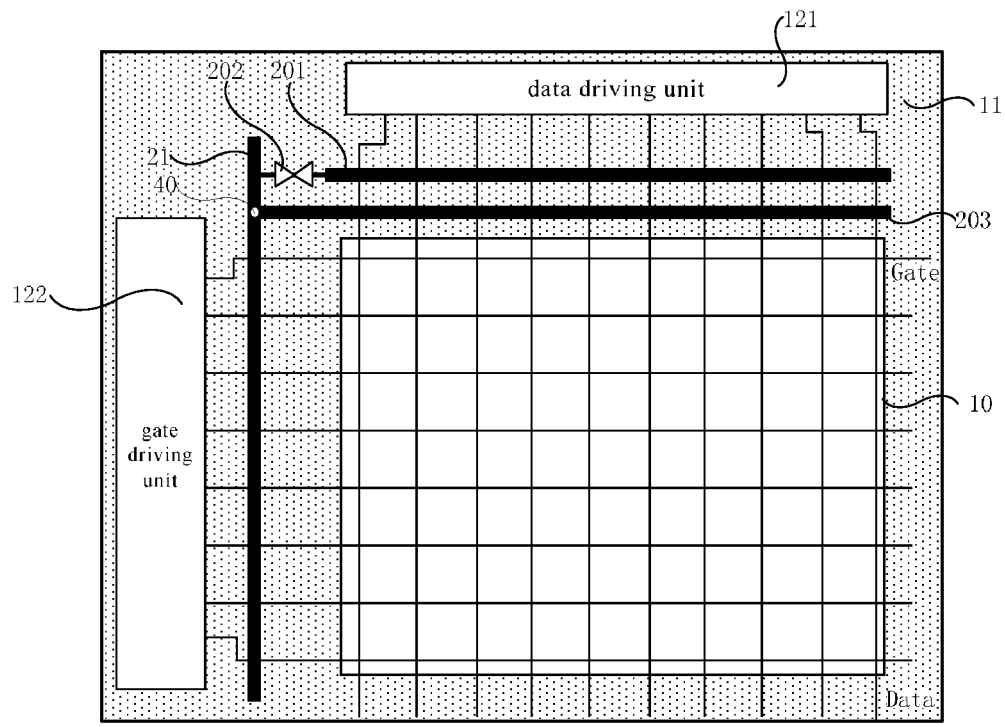
FIG. 7 is another schematic view showing the static charge shielding unit in FIG. 3.

In another possible embodiment of the present disclosure, as shown in FIG. 7, the static charge shielding unit 20 may include at least one shielding line 203 and the first electrostatic protection line 201.

The first electrostatic protection line 201 may be arranged parallel to the shielding line 203. In addition, the shielding line 203 may be arranged parallel to the gate lines Gate and created from a layer identical to the gate lines Gate. One end of the shielding line 203 may be connected to the static charge releasing line 21. Just like the first electrostatic protection line 201, in a possible embodiment of the present disclosure, a length of the shielding line 203 along the gate lines Gate is greater than a length of the display region 11 along the gate lines Gate.

In this regard, in the case that the static charges at the peripheral region 11 is released to the static charge releasing line 21 through the first electrostatic protection line 201, the static charges at the peripheral region 11 may also be released to the static charge releasing line 21 through the shielding line 203, so as to improve an effect of the static charge shielding unit 20.

Figure 8:
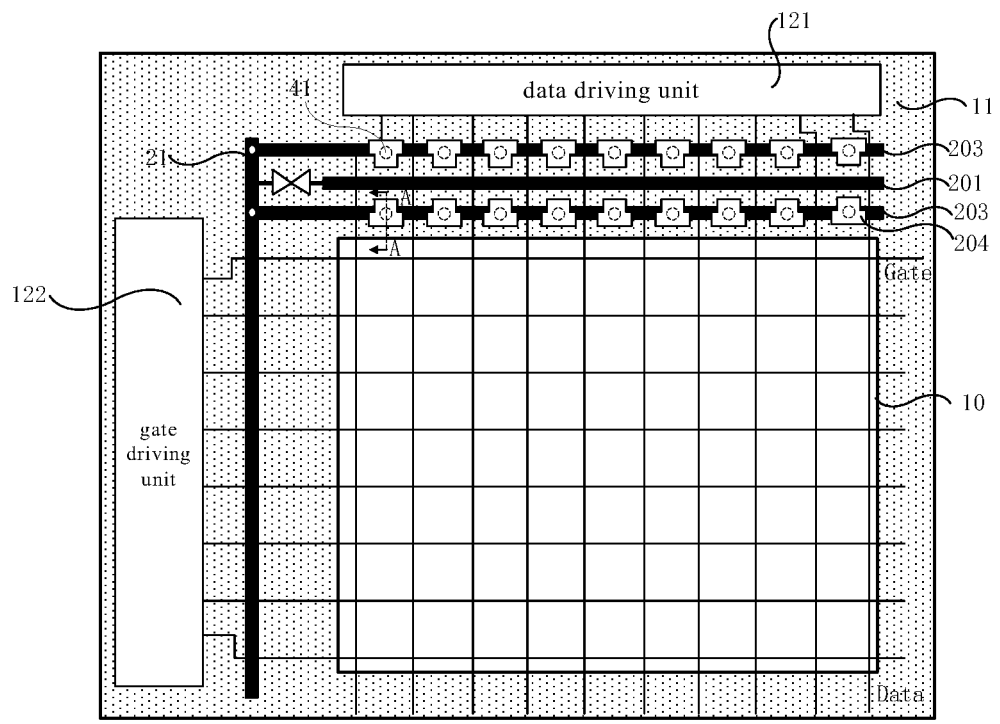
FIG. 8 is yet another schematic view showing the static charge shielding unit in FIG. 3.

Based on the above, the shielding line 203 and the first electrostatic protection line 201 may be created from a layer identical to the gate lines Gate. In this regard, during the formation of the gate lines Gate, the shielding line 203 and the first electrostatic protection line 201 may be formed through a single patterning process. The static charge releasing line 21 may be arranged parallel to the data line and created from a layer identical to the data line. One end of the shielding line 203 may be connected to the static charge releasing line 21. To be specific, the shielding line 203 may be connected to the static charge releasing line 21 through a first via-hole 40 as shown in FIG. 7. The first via-hole 40 may be arranged in a gate insulation layer, and the static charge releasing line 21 created from a layer identical to the data lines and the shielding line 203 created from a layer identical to the gate lines may be connected to each other through the first via-hole 40. Further, as shown in FIG. 8, the static charge shielding unit 20 may include two shielding lines 203. In this case, the first electrostatic protection line 201 may be arranged between the two shielding lines 203. Through the two shielding lines 203, it is able to further improve the effect of the static charge shielding unit 20.

It should be appreciated that, in FIG. 7, the description is given by taking the static charge shielding unit 20 including the first electrostatic protection line 201 and at least one shielding line 203 as an example. In addition, in the embodiments of the present disclosure, the static charge shielding unit 20 may merely include at least one shielding line 203.

Figure 9:
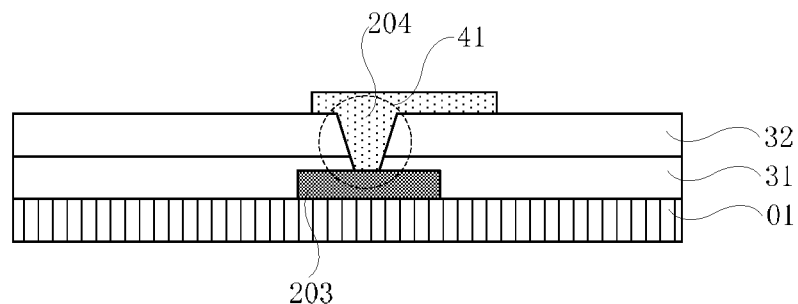
FIG. 9 is a sectional view of the static charge shielding unit along line A-A in FIG. 8.
Figure 10:
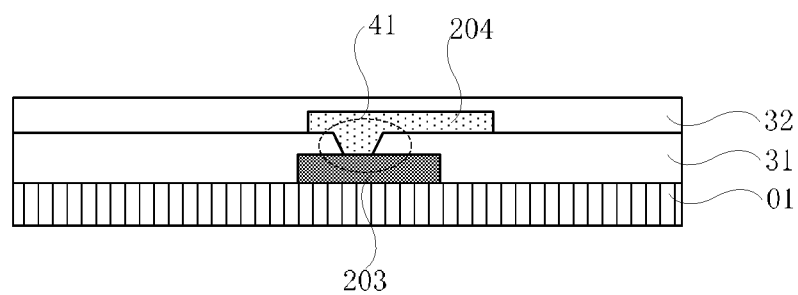
FIG. 10 is another sectional view of the static charge shielding unit along line A-A in FIG. 8.

Based on the above, when the shielding line 203 is created from a layer identical to the gate lines Gate, the gate lines Gate are located close to a base substrate 01, so the shielding line 203 may also be located close to the base substrate 01. For example, as shown in FIG. 9 or 10, the shielding line 203 is in direct contact with the base substrate 01. Some other film layers, such as a gate insulation layer 21 and a passivation layer 32 may be arranged on the base substrate 01, and after the shielding line 203 is covered by the gate insulation layer 31 and the passivation layer 32, it is impossible for the shielding line 203 to discharge the static charges generated above the shielding line 203, e.g., generated at a position in a layer identical to, or above, the gate insulation layer 31 or the passivation layer.

In order to solve the above-mentioned problem, in a possible embodiment of the present disclosure, in the case that the static charge shielding unit 20 includes at least one shielding line 203, for example, as shown in FIG. 7, when the static charge shielding unit 20 includes the first electrostatic protection line 201 and at least one shielding line 203, or when the static charge shielding unit 20 merely includes at least one shielding line 203, the static charge shielding unit 20 may, as shown in FIG. 8, further include at least one charge collection electrode 204 connected to the at least one shielding line 203 through a second via-hole 41. The shielding line 203 is in contact with the base substrate 01, so the charge collection electrode 204 connected to the shielding line 203 through the second via-hole 41 is necessarily located above the shielding line 203. Through the charge collection electrode 204, it is able to collect the static charges generated above the shielding line 203, and transport the collected static charges to the shielding line 203, and then release the static charges to the static charge releasing line 21 connected to the shielding line 203.

In order to improve a collection effect of the static charges, as shown in FIG. 8, each charge collection electrode 204 may be arranged between two adjacent data lines Data.

The structure of the charge collection electrode 204 will be described hereinafter in more details.

For example, when the array substrate includes a pixel electrode arranged above the passivation layer 32 in FIG. 9, the charge collection electrode 204 may be created from a layer identical to the pixel electrode. For another example, the charge collection electrode 204 may be also created from a layer identical to the data lines above the gate insulation layer 31 as shown in FIG. 10.

Figure 11:
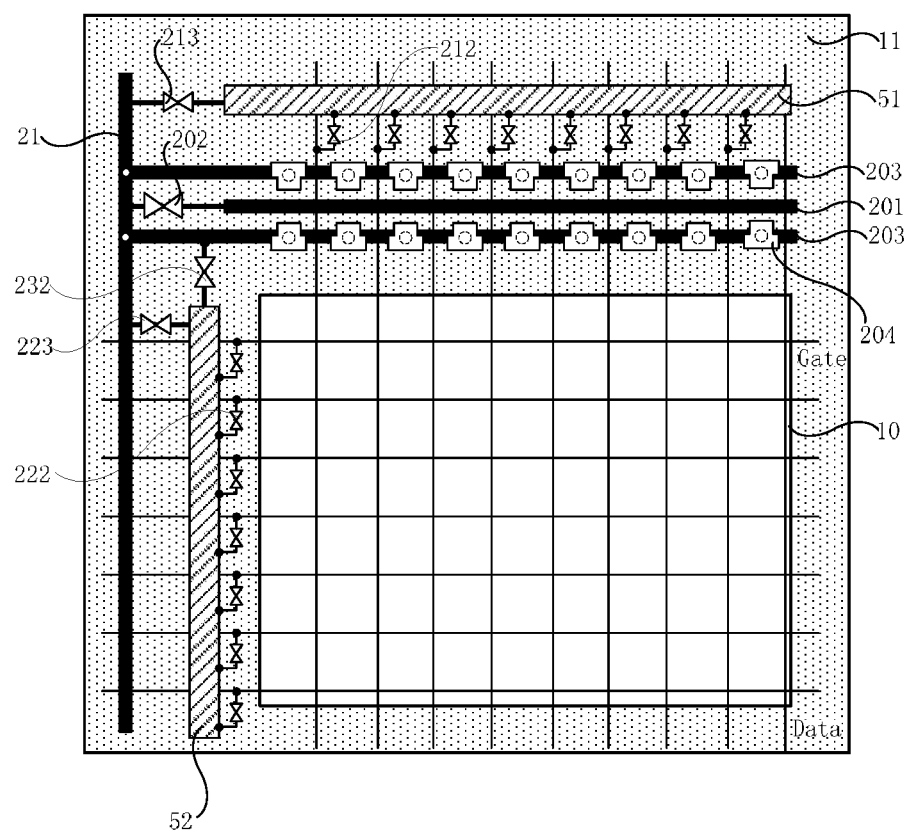
FIG. 11 is another schematic view showing the array substrate according to one embodiment of the present disclosure.

In order to further release the static charges on the data lines Data at the display region 10, in a possible embodiment of the present disclosure, the array substrate may further include, as shown in FIG. 11, a second electrostatic protection line 51, a second electrostatic protection unit 212 and a third electrostatic protection unit 213 at the peripheral region 11. The second electrostatic protection line 51 may be arranged parallel to the gate lines Gate and created from a layer identical to the gate lines Gate.

In addition, each data line Data may be connected to the second electrostatic protection line 51 through the second electrostatic protection unit 212. When there are static charges on the data line Data, they may be released to the second electrostatic protection line 51 through the second electrostatic protection unit 212.

In addition, the second electrostatic protection line 51 may be connected to the static charge releasing line 21 through the third electrostatic protection unit 213. Identically, when there are static charges on the second electrostatic protection line 51, they may be released to the static charge releasing line 21 through the third electrostatic protection unit 213.

In order to further release the static charges on the gate lines Gate at the display region 10, in a possible embodiment of the present disclosure, the array substrate may further include, as shown in FIG. 11, a third electrostatic protection line 52, a fourth electrostatic protection unit 222 and a fifth electrostatic protection unit 223 at the peripheral region 11. The third electrostatic protection line 52 may be arranged parallel to the data lines Data and created from a layer identical to the data lines Data.

In addition, each gate line Gate may be connected to the third electrostatic protection line 52 through the fourth electrostatic protection unit 222. When there are static charges on the gate line Gate, they may be released to the third electrostatic protection line 52 through the fourth electrostatic protection unit 222.

In addition, the third electrostatic protection line 52 may be connected to the static charge releasing line 21 through the fifth electrostatic protection unit 223. Identically, when there are static charges on the third electrostatic protection line 52, they may be released to the static charge releasing line 21 through the fifth electrostatic protection unit 223.

Based on the above, in order to further improve the effect of releasing the static charges on the gate lines Gate, as shown in FIG. 11, the array substrate may further include a sixth electrostatic protection unit 232 at the peripheral region 11. The third electrostatic protection line 52 may be connected to the static charge shielding unit 20 through the sixth electrostatic protection unit 232, e.g., the first electrostatic protection line 201 of the static charge shielding unit 20. In a possible embodiment of the present disclosure, the third electrostatic protection line 52 may be connected to the shielding line 203 through the sixth electrostatic protection unit 232. A function of the sixth electrostatic protection unit 232 may be similar to that mentioned above, and thus will not be particularly defined herein.

It should be appreciated that, any of the first electrostatic protection unit 202, the second electrostatic protection unit 212, the third electrostatic protection unit 213, the fourth electrostatic protection unit 222, the fifth electrostatic protection unit 223 and the sixth electrostatic protection unit 232 may have a structure as shown in FIG. 5 or 6, which will not be particularly defined herein.

The present disclosure further provides in some embodiments a display device including the above-mentioned array substrate. The structure and the beneficial advantages of the array substrate have been described hereinabove, and thus will not be particularly defined herein.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a display region and a peripheral region surrounding the display region, wherein gate lines and data lines crossing the gate lines are arranged at the display region and a static charge shielding unit is arranged at the peripheral region, wherein the array substrate further comprises a static charge releasing line connected to the static charge shielding unit, and the static charge shielding unit is configured to release static charges at the peripheral region through the static charge releasing line,
wherein the static charge shielding unit comprises:
a first electrostatic protection line,
a first electrostatic protection unit, and
at least one shielding line,
wherein the first electrostatic protection line and the at least one shielding line are parallel to the gate lines,
a length of the first electrostatic protection line along the gate lines is greater than a length of the display region along the gate lines,
a length of the at least one shielding line along the gate lines is greater than a length of the display region along the gate lines,
the first electrostatic protection line is connected to the static charge releasing line through the first electrostatic protection unit, and
the at least one shielding line is directly connected to the static charge releasing line,
wherein the array substrate further comprises a second electrostatic protection line, a second electrostatic protection unit and a third electrostatic protection unit arranged at the peripheral region, and wherein the second electrostatic protection line is arranged parallel to the gate lines, each data line is connected to the second electrostatic protection line through the second electrostatic protection unit, and the second electrostatic protection line is connected to the static charge releasing line through the third electrostatic protection unit.

2. The array substrate according to claim 1, wherein a data driving unit is arranged at the peripheral region and connected to the data lines, and the static charge shielding unit is arranged between the data driving unit and the display region.

3. The array substrate according to claim 1, wherein the at least one shielding line comprises two shielding lines, and the first electrostatic protection line is arranged between the two shielding lines.

4. The array substrate according to claim 1, wherein the static charge shielding unit further comprises at least one charge collection electrode connected to the at least one shielding line through a via-hole.

5. The array substrate according to claim 4, wherein the at least one charge collection electrode is arranged between two adjacent data lines.

6. The array substrate according to claim 1, wherein the static charge releasing line is a common electrode line.

7. The array substrate according to claim 4, further comprising a pixel electrode which is created from a layer identical to the at least one charge collection electrode.

8. The array substrate according to claim 4, wherein the at least one charge collection electrode is created from a layer identical to the data lines.

9. The array substrate according to claim 1, further comprising a third electrostatic protection line, a fourth electrostatic protection unit, a fifth electrostatic protection unit and a sixth electrostatic protection unit at the peripheral region, wherein each gate line is connected to the third electrostatic protection line through the fourth electrostatic protection unit, the third electrostatic protection line is connected to the static charge releasing line through the fifth electrostatic protection unit, and the third electrostatic protection line is connected to the at least one shielding line through the sixth electrostatic protection unit.

10. The array substrate according to claim 1, wherein the first electrostatic protection unit comprises two diode groups connected in parallel to each other, each diode group comprises at least one diode, the diodes in an identical diode group are connected to each other in an identical direction, and connection directions of the diodes in different diode groups are different.

11. The array substrate according to claim 1 wherein each of the second electrostatic protection unit and the third electrostatic protection unit comprises two diode groups connected in parallel to each other, each diode group comprises at least one diode, the diodes in an identical diode group are connected to each other in an identical direction, and connection directions of the diodes in different diode groups are different.

12. The array substrate according to claim 9, wherein the static charge releasing line and the third static charge protection line are both arranged parallel to, and created from a layer identical to, the data lines.

13. The array substrate according to claim 1, wherein the at least one shielding line is arranged parallel to the gate lines, and one end of the at least one shielding line is connected to the static charge releasing line.

14. The array substrate according to claim 1, wherein the first electrostatic protection line, the second electrostatic protection line and the shielding line are created from a layer identical to the gate lines.

15. A display device comprising the array substrate according to claim 1.

16. The array substrate according to claim 4, wherein a projection of the at least one charge collection electrode on the array substrate is only overlapped with a projection of the at least one shielding line on the array substrate.

17. An array substrate, comprising a display region and a peripheral region surrounding the display region, wherein gate lines and data lines crossing the gate lines are arranged at the display region and a static charge shielding unit is arranged at the peripheral region, wherein the array substrate further comprises a static charge releasing line connected to the static charge shielding unit, and the static charge shielding unit is configured to release static charges at the peripheral region through the static charge releasing line,
wherein the static charge shielding unit comprises:
a first electrostatic protection line,
a first electrostatic protection unit, and
at least one shielding line,
wherein the first electrostatic protection line and the at least one shielding line are parallel to the gate lines,
a length of the first electrostatic protection line along the gate lines is greater than a length of the display region along the gate lines,
a length of the at least one shielding line along the gate lines is greater than a length of the display region along the gate lines,
the first electrostatic protection line is connected to the static charge releasing line through the first electrostatic protection unit, and
the at least one shielding line is directly connected to the static charge releasing line
wherein the array substrate further comprises a second electrostatic protection line, a second electrostatic protection unit, a third electrostatic protection unit and a fourth electrostatic protection unit at the peripheral region, wherein each gate line is connected to the second electrostatic protection line through the second electrostatic protection unit, the second electrostatic protection line is connected to the static charge releasing line through the third electrostatic protection unit, and the second electrostatic protection line is connected to the at least one shielding line through the fourth electrostatic protection unit,
and wherein each of the second electrostatic protection unit, the third electrostatic protection unit and the fourth electrostatic unit comprises two diode groups connected in parallel to each other, each diode group includes at least one diode, the diodes in an identical diode group are connected to each other in an identical direction, and connection directions of the diodes in different diode groups are different.

18. An array substrate comprising:
a display region;
a peripheral region surrounding the display region;
gate lines arranged at the display region;
a static charge shielding unit arranged at the peripheral region; and
a static charge releasing line connected to the static charge shielding unit;
wherein the static charge shielding unit is configured to release static charges at the peripheral region through the static charge releasing line, and the static charge shielding unit comprises a first electrostatic protection line, a first electrostatic protection unit, and at least one shielding line, wherein the first electrostatic protection line and the at least one shielding line are parallel to the gate lines, a length of the first electrostatic protection line along the gate lines is greater than a length of the display region along the gate lines, a length of the at least one shielding line along the gate lines is greater than a length of the display region along the gate lines, the first electrostatic protection line is connected to the static charge releasing line through the first electrostatic protection unit, and the at least one shielding line is directly connected to the static charge releasing line;
and wherein the array substrate further comprises a second electrostatic protection line, a second electrostatic protection unit and a third electrostatic protection unit arranged at the peripheral region, wherein the second electrostatic protection line is arranged parallel to the gate lines, each data line is connected to the second electrostatic protection line through the second electrostatic protection unit, and the second electrostatic protection line is connected to the static charge releasing line through the third electrostatic protection unit.

* * * * *